United States Patent [19]
Yoshihisa

[11] Patent Number: 6,051,873
[45] Date of Patent: Apr. 18, 2000

[54] SEMICONDUCTOR DEVICE INCLUDING SELF-ALIGNED BASE AND EMITTER ELECTRODES

[75] Inventor: Yasuki Yoshihisa, Tokyo, Japan

[73] Assignee: Mitsubishi Denki Kabushiki Kaisha, Tokyo, Japan

[21] Appl. No.: 09/007,169

[22] Filed: Jan. 14, 1998

[30] Foreign Application Priority Data

Jul. 4, 1997 [JP] Japan ................................ 9-179666

[51] Int. Cl.[7] ................................................ H01L 21/265
[52] U.S. Cl. ................................................ 257/588; 438/325
[58] Field of Search .................................... 257/511, 517, 257/525, 526, 539, 542, 552, 555, 556, 557, 565, 575, 588; 438/325

[56] References Cited

U.S. PATENT DOCUMENTS 4,492,008  1/1985  Anantha et al. .................. 257/511
5,288,652  2/1994  Wang et al. ...................... 438/202
5,557,131  9/1996  Lee .................................. 257/370

FOREIGN PATENT DOCUMENTS 6-349841  12/1994  Japan .

OTHER PUBLICATIONS

S. Wolf and R.N. Tauber "Silicon Processing for The VLSI Era" Lattice Press, v. 1, p. 522, 1986.

Primary Examiner—Olik Chaudhuri
Assistant Examiner—Anh Duy Mai
Attorney, Agent, or Firm—McDermott, Will & Emery

[57] ABSTRACT

An oxide film mask 6b of a desired shape is formed on the surface of a polysilicon film 5a which becomes a base electrode and the top of the polysilicon film 5a is isotropically etched with the mask 6b, then the polysilicon film 5a is anisotropically etched with the same mask 6b for exposing an epitaxial layer 3.

6 Claims, 8 Drawing Sheets

SEMICONDUCTOR DEVICE INCLUDING SELF-ALIGNED BASE AND EMITTER ELECTRODES

DETAILED DESCRIPTION OF THE INVENTION

1. Field of the Invention

This invention relates to a semiconductor device comprising an emitter electrode formed in a self-alignment manner with a base electrode and a method of manufacturing the semiconductor device.

2. Description of the Related Art

In recent years, development of a bipolar transistor using a manufacturing method forming an emitter electrode is a self-alignment manner with a base electrode not subject to constraints of mask alignment accuracy has been active with high integration of bipolar transistors.

An npn bipolar transistor described in Japanese Patent Laid-Open No. Hei 2-129959 will be discussed with reference to FIG. 8 as one example of the conventional bipolar transistors manufactured using such a self-alignment method. FIG. 8 is a sectional view of the main part to show a structure of the conventional npn bipolar transistor, particularly in emitter and base electrodes and in the proximity of the electrodes.

The bipolar transistor shown in FIG. 8 is formed with an oxide film 4 on one main face of an n-type semiconductor substrate 20 and comprises a p-type external base region 8, an intrinsic base region 10, and an n-type emitter region 13 surrounded by the intrinsic base region 10, in an active region surrounded by the oxide film 4 on the main face. It also comprises a base electrode 25 contacting to the external base region 8 and extending on the oxide film 4, an emitter electrode 12 contacting to the emitter region 13, and an insulating film 26 sandwiched between the base and emitter electrodes 25 and 12 on the main face of the substrate 20.

On the other hand, to furthermore reduce the bipolar transistor as described above, it becomes necessary not only to reduce the intrinsic base region 10, but also to thin the insulating film 26. However, in the conventional bipolar transistor, as the insulating film 26 is thinned, it is degraded in insulating characteristic and an increase in a current gain in the operation state of the transistor becomes obvious. Thus, reliability of the bipolar transistor lowers.

It is therefore an object of the invention to provide a semiconductor device having high reliability by improving the insulating characteristic between a base electrode and an emitter electrode.

According to the invention, there is provided a semiconductor device comprising an impurity region of first conductive type being formed on one main face of a semiconductor substrate, a part of the impurity region being exposed to a surface of the substrate, an impurity region of second conductive type being surrounded by the impurity region of first conductive type, a part of the impurity region of second conductive type being exposed to the surface of the substrate, a first electrode being formed on the semiconductor substrate and connected to the exposure face of the impurity region of first conductive type, a second electrode being formed on the semiconductor substrate and connected to the exposure face of the impurity region of second conductive type, and an insulating film being sandwiched between the first and second electrodes, characterized in that the tip end part of a proximity region of the first electrode to the second electrode is cut away.

The distance to the second electrode in the top end part of the proximity region is longer than the distance to the second electrode in a portion other than the top end part of the proximity region.

The top end part of the proximity region is cut away by isotropic etching.

Preferably the top edge of the adjacent region is a round-shaped portion.

The impurity region of first conductive type is a base region and the first electrode is a base electrode.

The impurity region of second conductive type is an emitter region and the second electrode is an emitter electrode.

According to the invention, there is provided a semiconductor device manufacturing method comprising the steps of forming a first conductive layer on one main face of a semiconductor substrate, forming an etching resistance mask of a desired shape on a surface of the first conductive layer, isotropically etching the top of the first conductive layer with the mask, anisotropically etching the first conductive layer with the mask for exposing the semiconductor substrate, forming an insulating film so as to cover the semiconductor substrate surface and the first conductive layer, etching back the insulating film for exposing the semiconductor substrate, and forming a second conductive layer on the semiconductor substrate exposed by etching back the insulating film.

The anisotropically etching step is a step of forming an opening for exposing the semiconductor substrate in the first conductive layer, and a diameter of the opening is less than a thickness of the first conductive layer.

The semiconductor device manufacturing method may further comprise the steps of patterning the first conductive layer to an first electrode, and forming an impurity region electrically connected to the first electrode on the main face of the semiconductor substrate.

The impurity region is a base region and the first electrode is a base electrode.

The semiconductor device manufacturing method may further comprise the steps of patterning the second conductive layer to an second electrode, and forming an impurity region electrically connected to the second electrode on the main face of the semiconductor substrate.

The impurity region is an emitter region and the second electrode is an emitter electrode.

According to the invention, there is provided a semiconductor device manufacturing method comprising the steps of forming an impurity region of second conductive type on one main face of a semiconductor substrate of first conductive type, forming an epitaxial layer of second conductive type on the semiconductor substrate so as to cover the impurity region of second conductive type, forming a first polysilicon film so as to contact to the epitaxial layer, doping the first polysilicon film with impurities of first conductive type, forming a first silicon oxide film on the first polysilicon film, patterning the first silicon oxide film to a desired shape and forming a mask, isotropically etching the top of the first polysilicon film with the mask, anisotropically etching the first polysilicon film with the mask for exposing the epitaxial layer, diffusing the impurities with which the first polysilicon film is doped from a contact face between the first polysilicon film and the epitaxial layer to the epitaxial layer and forming an external base region, forming a second silicon oxide film on a surface of the epitaxial layer, forming an intrinsic base region in a portion of the epitaxial layer where the second silicon oxide film is formed by ion implantation, forming a third silicon oxide film on the epitaxial layer, etching back the third silicon oxide film for exposing the intrinsic base region, forming a second polysilicon film on the epitaxial layer and the third silicon oxide film so as to contact to the exposed intrinsic base region, doping the second polysilicon film with impurities of second conductive type, and diffusing the impurities with which the second polysilicon film is doped from a contact face between the second polysilicon film and the epitaxial layer to the epitaxial layer and forming an emitter region surrounded by the intrinsic base region.

The second silicon oxide film is a thermal oxide film.

The third silicon oxide film is a TEOS (tetra-ethyl-ortho-silicate) film.

The isotropic etching is performed by using a dry etching method.

The isotropic etching and the anisotropic etching are performed successively in the same system.

Mixture gas of $SF_6$, HBr, and He is used in the isotropic etching step.

DESCRIPTION OF THE PREFERRED EMBODIMENTS

First embodiment

Figure 1:
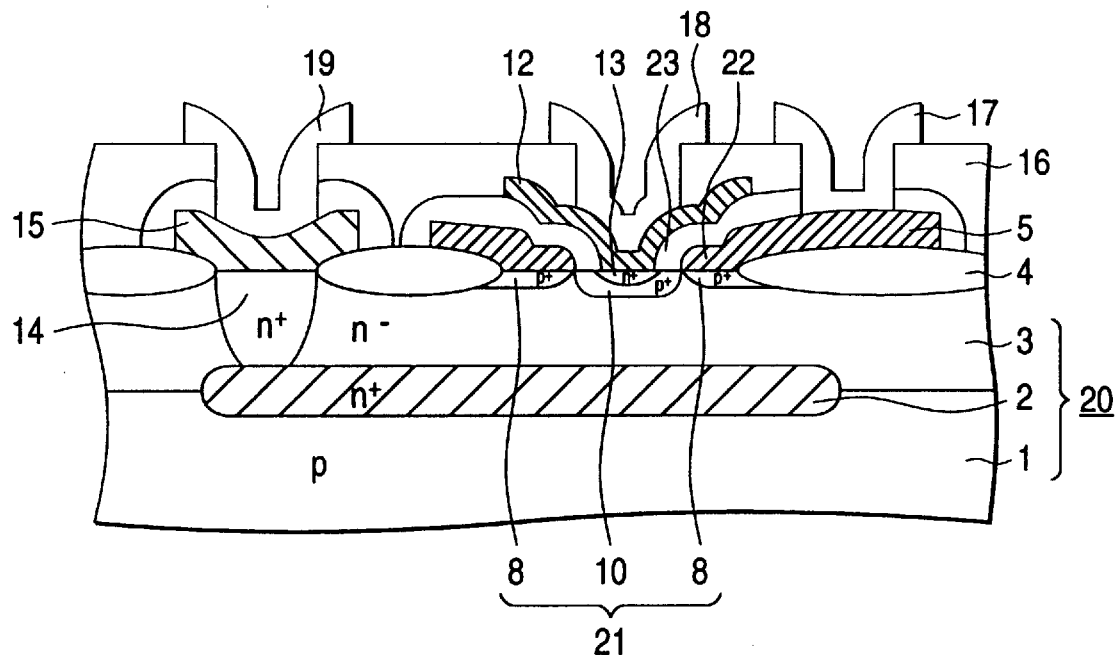
FIGS. 1(a) and 1(b) are sectional views of the main part to show a structure of a semiconductor device in a first embodiment of the invention.
Figure 1:
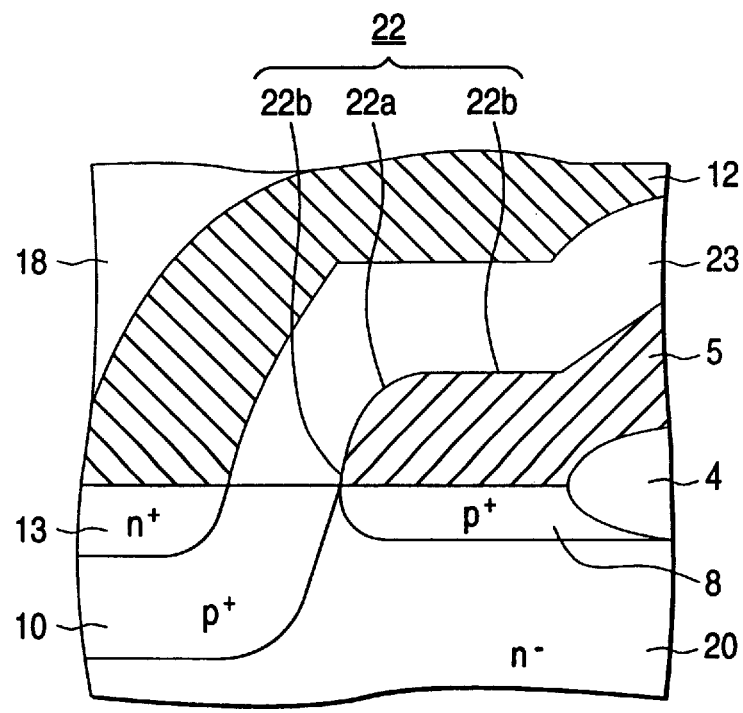
Figure 2:
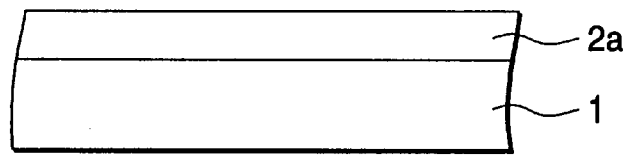
FIGS. 2(a)–2(c) are sectional views of the main part to show a manufacturing process of the semiconductor device in the first embodiment of the invention in the step order.
Figure 2:
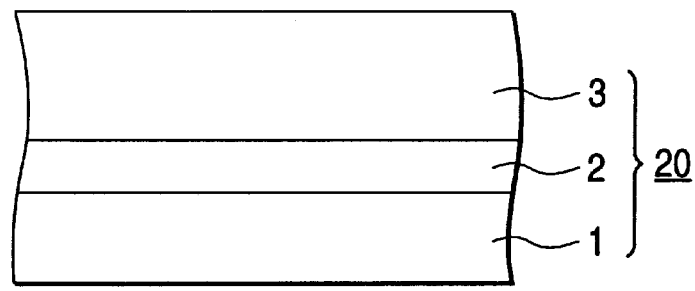
Figure 2:
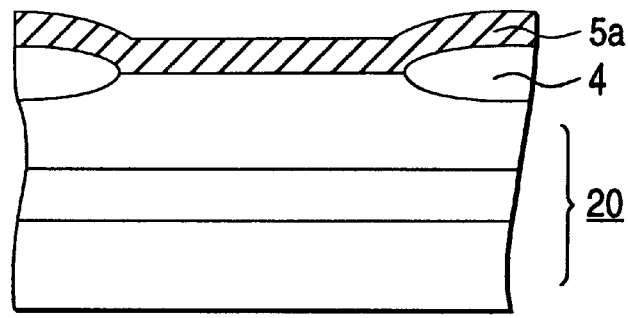
Figure 3:
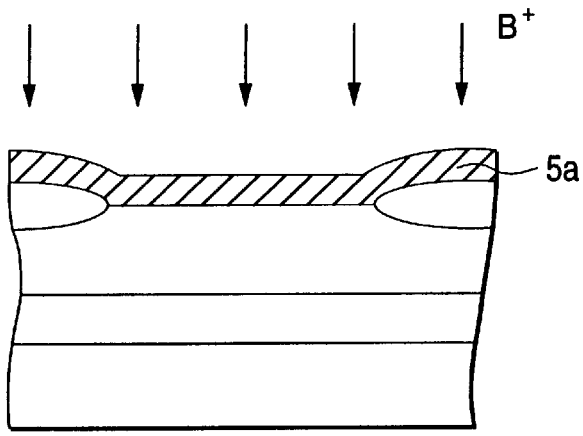
FIGS. 3(a)–3(c) are sectional views of the main part to show a manufacturing process of the semiconductor device in the first embodiment of the invention in the step order.
Figure 3:
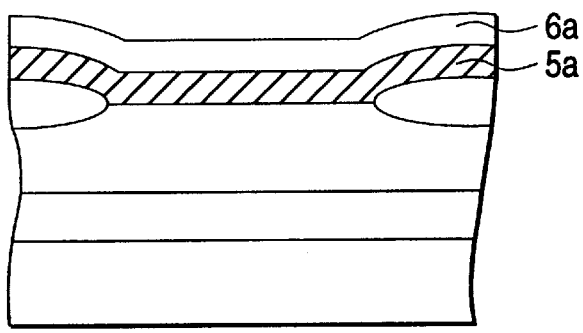
Figure 3:
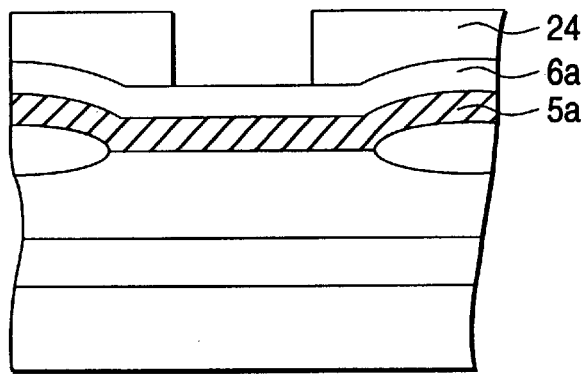
Figure 4:
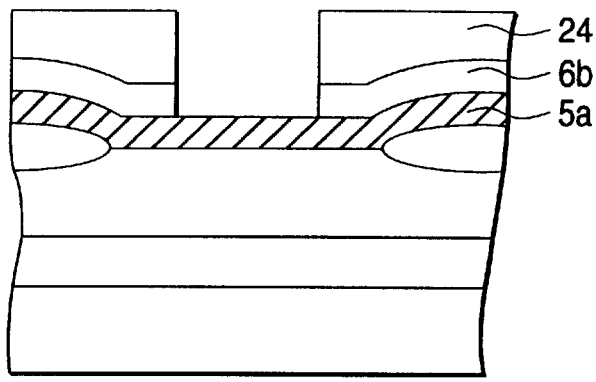
FIGS. 4(a)–4(c) are sectional views of the main part to show a manufacturing process of the semiconductor device in the first embodiment of the invention in the step order.
Figure 4:
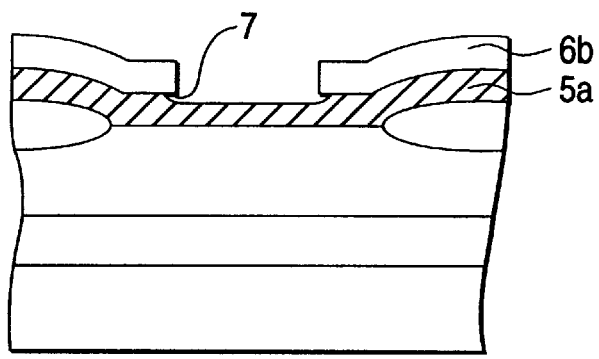
Figure 4:
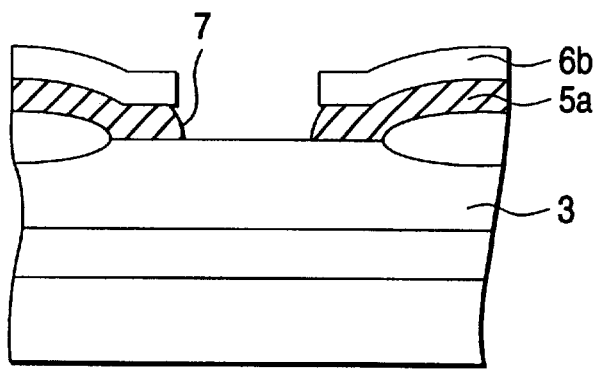
Figure 5:
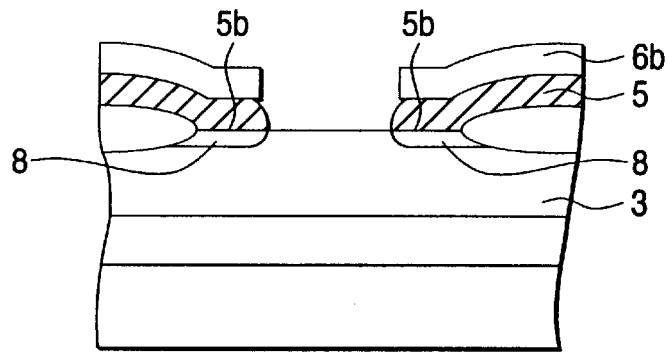
FIGS. 5(a)–5(c) are sectional views of the main part to show a manufacturing process of the semiconductor device in the first embodiment of the invention in the step order.
Figure 5:
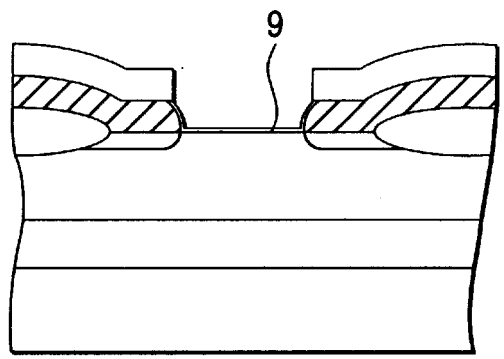
Figure 5:
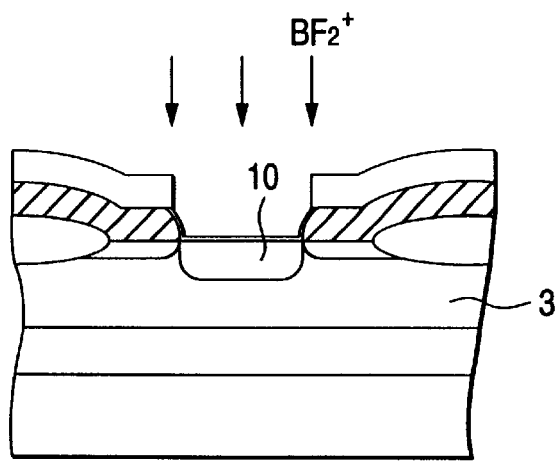
Figure 6:
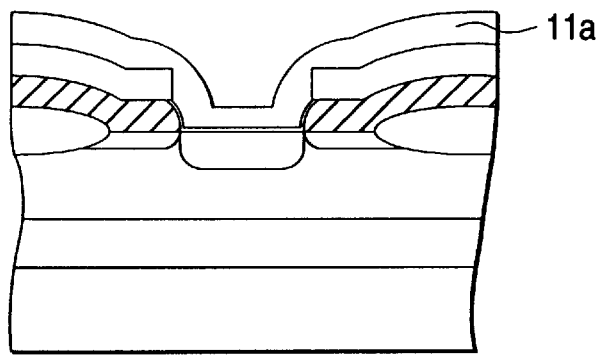
FIGS. 6(a)–6(c) are sectional views of the main part to show a manufacturing process of the semiconductor device in the first embodiment of the invention in the step order.
Figure 6:
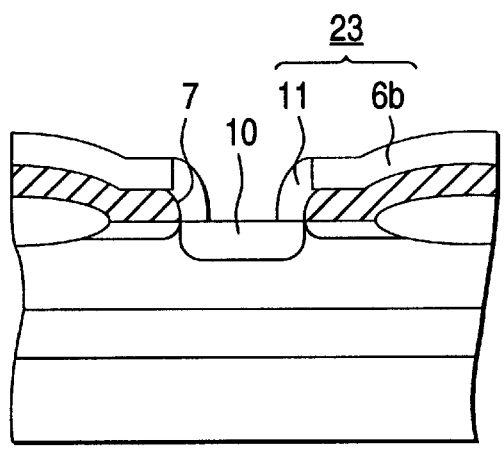
Figure 6:
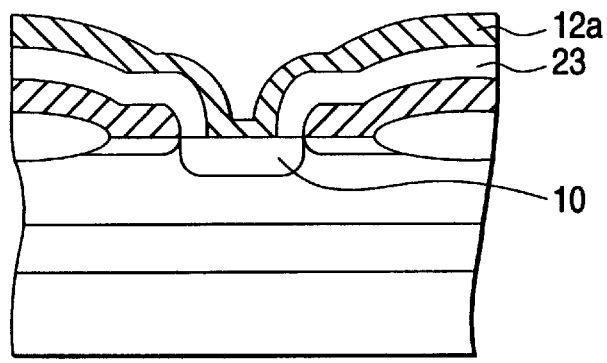
Figure 7:
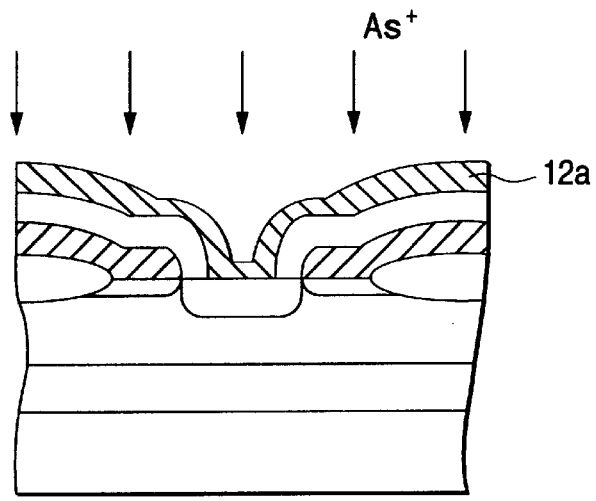
FIGS. 7(a–7(c) are sectional views of the main part to show a manufacturing process of the semiconductor device in the first embodiment of the invention in the step order.
Figure 7:
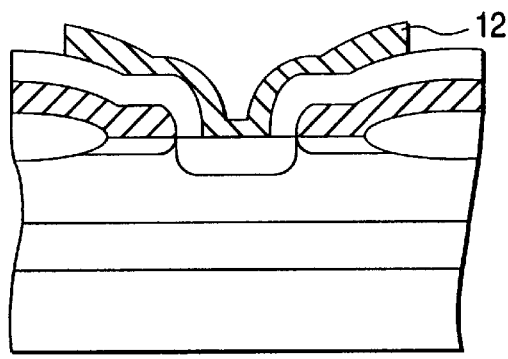
Figure 7:
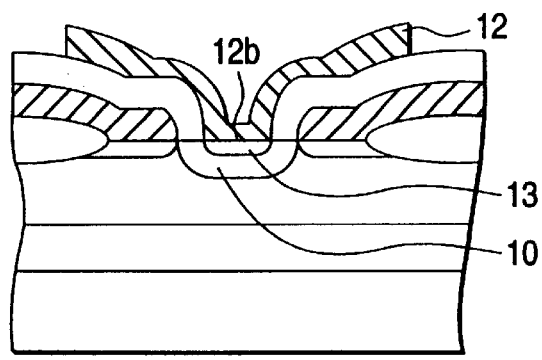
Figure 8:
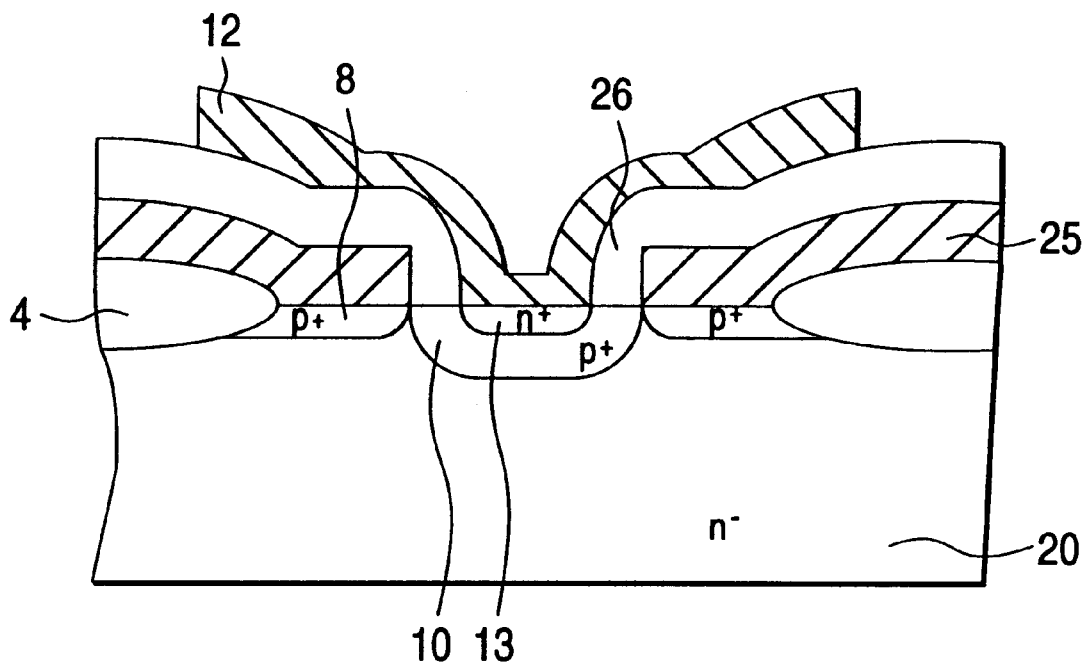
FIG. 8 is a sectional view of the main part to show a structure of a conventional npn bipolar transistor.

A first embodiment of the invention will be discussed with reference to FIGS. 1 to 7.

FIG. 1(a) is a sectional view of the main part to show a structure of a semiconductor device in the first embodiment of the invention. FIG. 1(b) is enlarged view of the main part of FIG. 1(a) and more particularly a sectional view of the main part in emitter and base electrodes and in the proximity of the electrodes.

In FIG. 1(a), number 1 is a p-type semiconductor substrate main body made of, for example, single crystal silicon, numeral 2 is a high-concentration n-type, namely, n+ embedded impurity region, number 3 is a low-concentration n-type, namely, n-Si epitaxial layer, and numeral 20 is a semiconductor substrate consisting of the substrate main body 1, the embedded impurity region 2, and the epitaxial layer 3.

Numeral 4 is an insulating film made of a silicon oxide film formed on the main surface of the semiconductor substrate 20, number 5 is a base electrode contacting to an external base region 8 of a part of the area surrounded by the insulating film 4 on the surface of the substrate 20 and extending on the insulating film 4, numeral 10 is an intrinsic base region of a part of the area surrounded by the insulating film 4 on the surface of the substrate 20 like the external base region 8, the intrinsic base region 10 being surrounded by the external base region 8, and numeral 21 is a base region consisting of the intrinsic base region 10 and the external base region 8.

Numeral 12 is an emitter electrode contacting to an emitter region 13 surrounded by the intrinsic base region 10 and extending on an insulating film 23 made of, for example, a TEOS (tetra-ethyl-ortho-silicate) film with the insulating film 23 sandwiched between the emitter electrode 12 and the base electrode 5, and numeral 22 is a proximity region of the base electrode 5 to the emitter electrode 12.

Numeral 14 is a collector wall, numeral 15 is a collector electrode, numeral 16 is an interlayer insulating film and numerals 17, 18 and 19 are wiring layers.

In FIG. 1(b), numeral 22a is a top end part in the proximity region 22 of the base electrode 5 to the emitter electrode 12 and numeral 22b is a portion other than the top end part 22a in the proximity region 22.

The top end part 22a, which is cut away by isotropic etching as described later, has a longer distance to the emitter electrode 12 as compared with other portion 22b in the proximity region 22. That is, the spacing between the base electrode 5 and the emitter electrode 12 in the top end part 22a is wider than that in other portion 22b.

Next, a manufacturing method of the semiconductor device thus configured will be discussed particularly for the base and emitter regions in the step order with reference to FIGS. 2 to 7. The collector region may be formed as formerly and therefore will not be discussed.

First, as shown in FIG. 2(a), an n+ impurity region 2a which becomes the embedded impurity region 2 is formed on the p-type semiconductor substrate main body 1 made of, for example, single crystal silicon by using an ion implantation method.

Next, as shown in FIG. 2(b), the n– Si epitaxial layer 3 is grown on the semiconductor substrate main body 1 so as to cover the n+ impurity region 2, for example, by using a metal organic chemical vapor deposition (MOCVD) method, thereby forming the semiconductor substrate 20.

Next, as shown in FIG. 2(c), the insulating film 4 made of a silicon oxide film surrounding the regions in which the base region 23 and the emitter region 13 will be formed in later steps is formed on the main surface of the semiconductor substrate 20 formed as described above, for example, by using a LOCOS (local oxidation of silicon) method, etc.

Subsequently, a conductive film 5a made of a polysilicon film about 0.1–0.3 μm is formed so as to cover the semiconductor substrate 20 and the insulating film 4, for example, by using a CVD (chemical vapor deposition) method.

Next, as shown in FIG. 3(a), a p-type dopant, such as B, is ion-implanted into the polysilicon film 5a.

Next, as shown in FIG. 3(b), an insulating film 6a made of a silicon oxide film is formed about 0.2–0.4 μm so as to cover the polysilicon film 5a, for example, by using the CVD method, etc.

Subsequently, although not shown in the figure, the silicon oxide film 6a and the polysilicon film 5a are worked to desired shapes by using photo lithography process and anisotropic etching techniques; specifically, for example, the films are worked to such shapes to position the ends on the insulating film 4 and the position of one end of the base electrode 5 is defined.

Next, as shown in FIG. 3(c), a resist mask 24 having an opening at the region corresponding to the region in which the intrinsic base region 10 will be formed in a later step is formed on the silicon oxide film 6a.

Next, as shown in FIG. 4(a), the silicon oxide film 6a is patterned by anisotropic etching using the resist mask 24 to form an etching mask 6b for the polysilicon film 5a.

Next, as shown in FIG. 4(b), isotropic dry etching, for example, using mixture gas of $SF_6$, HBr, and He as etching gas is applied to the polysilicon film 5a by using the oxide film mask 6b for etching away the top of the polysilicon film 5a by about 50–150 nm, whereby an end part 7 of the etched region of the polysilicon film 5a is rounded. At this time, the flow quantity ratio between $SF_6$ and HBr specifically is set to about $SF_6$:HBr=2:1, for example.

Next, as shown in FIG. 4(c), following the isotropic dry etching step, in the same etching system as applying the isotropic dry etching, anisotropic dry etching, for example, using mixture gas of $SF_6$, HBr, and He as etching gas is applied to the polysilicon film 5a by using the oxide film mask 6b for exposing the surface of the epitaxial layer 3. At this time, the flow quantity ration between $SF_6$ and HBr specifically is set to about $SF_6$:HBr=1:1, for example.

The polysilicon film 5a is patterned to a similar shape to that of the mask 6b, forming the base electrode 5. However, at this time, the rounded portion 7 formed by the isotropic etching remains.

Next, as shown in FIG. 5(a), the p-type dopant, such as B, contained in the base electrode 5 is diffused from a contact face 5b between the base electrode 5 and the epitaxial layer 3 to the n-epitaxial layer 3, forming the p-type external base region 8 in the n-region 3.

Next, as shown in FIG. 5(b), thermal oxidation is executed to form a thermal oxide film 9 about 10 nm thick on the base electrode 5 and the surface of the exposed epitaxial layer 3. However, the film thickness of the oxide film 9 may be determined appropriately in response to the implantation condition in ion implantation used to form the intrinsic base region 10.

Next, as shown in FIG. 5(c), a p-type dopant, such as $BF_2$, is ion-implanted into the epitaxial layer 3 across the silicon oxide film 9 formed as described above, forming the p-type intrinsic base region 10.

Next, as shown in FIG. 6(a), an insulating film 11 having good step coverage like a TEOS film is formed about 0.1–0.3 μm thick on the full face on the epitaxial layer 3, for example, by using the CVD method, etc.

Next, as shown in FIG. 6(b), the insulating film 11a is etched back and at the same time, a part of the insulating film 9 is also removed for exposing a part of the intrinsic base region 10. At this time, the side face having the taper portion 7 of the base electrode 5 is covered with the spacer film 11 about 0.05–0.2 μm thick made of, for example, a TEOS film.

Next, as shown in FIG. 6(c), a conductive film 12a made of, for example, a polysilicon film is formed on the insulating film 23 consisting of the oxide film mask 6b and the spacer film 11 so as to contact to a part of the exposed intrinsic base region 10.

Next, as shown in FIG. 7(a), an n-type dopant, such as As, is ion-implanted into the polysilicon film 12a.

Next, as shown in FIG. 7(b), the polysilicon film 12a is patterned to a desired shape by using photo lithography and anisotropic etching techniques for forming the emitter electrode 12.

Next, as shown in FIG. 7(c), the n-type dopant, such as As, contained in the emitter electrode 12 is diffused by heating from a contact face 12b between the emitter electrode 12 and the epitaxial layer 3 to the epitaxial layer 3, forming the n-type emitter region 13 surrounded by the intrinsic base region 10.

Then, the interlayer insulating film 16 is formed on the substrate 20 and wiring layers 17 and 18 connecting to the base electrode 5 or the emitter electrode 12 are formed by using photo lithography and anisotropic etching techniques, etc., for providing the semiconductor device shown in FIG. 1.

In the first embodiment, isotropic etching is executed before anisotropic etching in the forming step of the base electrode 5 unlike the conventional forming step. Thus, the end part 7 of the etched region of the polysilicon film 5a, namely, the top end part 22a of the proximity region of the base electrode 5 to the emitter electrode is rounded.

Thus, the emitter electrode 12 is formed in a self-alignment manner as compared with the conventional semiconductor devices. Even if the opening diameter of the mask 6b formed so as to have a opening on the region which becomes the intrinsic base region 10 in the later step is the same as that in the conventional semiconductor device, the spacing between the base electrode 5 and the emitter electrode 12 can be held wide and the insulating characteristic between the electrodes can be improved, preventing a short circuit, etc., and improving the reliability at the operation time.

In the first embodiment, dry etching is applied with mixture gas of $SF_6$, HBr, and He as etching gas. Thus, the isotropic etching step and the anisotropic etching step can be conducted successively in the same system simply by changing the flow quantity ration between $SF_6$ and HBr, namely, the isotropic etching step can be immediately followed by the anisotropic etching step without exposure to outside air. Therefore, a higher-reliability semiconductor device can be provided and manufacturing thereof can be facilitated.

However, the invention is not limited to the etching gas used as above; any other gas may be used for the etching step. The isotropic etching and anisotropic etching may be performed in separate etching apparatuses and the isotropic etching step may be applied by wet etching process.

In the first embodiment, anisotropic etching is used to expose the region which becomes the intrinsic base region 10 in the later step, so that the intrinsic base region 10 can be formed precisely in a desired region.

In the first embodiment, an insulating film having good step coverage and conformity such as a TEOS film is used as the insulating film 11a which becomes the spacer film 11. Thus, the insulating film 11a can be formed without causing defects such as cavities for the base electrode 5 and the oxide film mask 6b thereon which are made complicated shape by the isotropic etching and anisotropic etching, and the film thickness of the spacer film 11 can be controlled easily. Therefore, a semiconductor device having stable characteristics can be provided.

In the invention, however, the insulating film 11a is not limited to the TEOS film; any other film may be used. If this film is good in step coverage and conformity, it produces similar effects to those described above.

In the first embodiment, we have discussed the npn-type semiconductor device as an example. However, a pnp-type semiconductor device of a similar structure can also be provided by using a similar manufacturing method only by replacing n-type and p-type impurities in the description made above.

As the area of the emitter and base contact region is smaller, an inner edge of the base electrode is m ore abrupt. Then as the inner edge of the base electrode is more abrupt, the problem of short between base electrode and emitter electrode is larger. Therefore the present invention is more effective in the case that a diameter of the opening is less than a thickness of the first conductive layer.

The first embodiment relates to a bipolar transistor, as a second embodiment, the conductive layer is applicable to a multi-layered structure in VLSI.

The semiconductor device according to the invention comprises an impurity region of first conductive type being formed on one main face of a semiconductor substrate, a part of the impurity region being exposed to a surface of the substrate, an impurity region of second conductive type being surrounded by the impurity region of first conductive type, a part of the impurity region of second conductive type being exposed to the surface of the substrate, a first electrode being formed on the semiconductor substrate and connected to the exposure face of the impurity region of first conductive type, a second electrode being formed on the semiconductor substrate and connected to the exposure face of the impurity region of second conductive type, and an insulating film being sandwiched between the first and second electrodes, characterized in that the top edge of a region of the first electrode facing most adjacently to the second electrode is cut away. Thus, the spacing between the first and second electrodes in the top edge of the adjacent region can be held wide and the insulating characteristic between the electrodes can be improved, improving the reliability.

The distance to the second electrode in the top edge of the adjacent region is longer than the distance to the second electrode in a portion other than the top edge of the adjacent region. Thus, the spacing between the first and second electrodes in the top edge of the adjacent region can be held wide and the insulating characteristic between the electrodes can be improved, improving the reliability.

The top edge of the adjacent region is cut away by isotropic etching. Thus, the top edge of the adjacent region is rounded, the spacing between the first and second electrodes can be held wide, and the insulating characteristic between the electrodes can be improved, improving the reliability.

The impurity region of first conductive type is a base region and the first electrode is a base electrode. Thus, the spacing between the base electrode and the second electrode can be held wide and the insulating characteristic between the electrodes can be improved, improving the reliability.

The impurity region of second conductive type is an emitter region and the second electrode is an emitter electrode. Thus, the spacing between the first electrode and the emitter electrode can be held wide and the insulating characteristic between the electrodes can be improved, improving the reliability.

The semiconductor device manufacturing method according to the invention comprises the steps of forming a first conductive layer on one main face of a semiconductor substrate, forming an etching resistance mask of a desired shape on a surface of the first conductive layer, isotropically etching the top of the first conductive layer with the mask, anisotropically etching the first conductive layer with the mask for exposing the semiconductor substrate, forming an insulating film so as to cover the semiconductor substrate surface and the first conductive layer, etching back the insulating film for exposing the semiconductor substrate, and forming a second conductive layer on the semiconductor substrate exposed by etching back the insulating film. Thus, the top edge of the first conductive layer in the region facing adjacently to the second conductive layer is rounded, the spacing between the conductive layer and the different conductive layer in the top end part can be held wide, and the insulating characteristic between the conductive layers can be improved, providing a semiconductor device having high reliability.

The semiconductor device manufacturing method according to the invention comprises the steps of forming an impurity region of second conductive type on one main face of a semiconductor substrate of first conductive type, forming an epitaxial layer of second conductive type on the semiconductor substrate so as to cover the impurity region of second conductive type, forming a first polysilicon film so as to contact to the epitaxial layer, doping the first polysilicon film with impurities of first conductive type, forming a first silicon oxide film on the first polysilicon film patterning the first silicon oxide film to a desired shape and forming a mask, isotropically etching the top of the first polysilicon film with the mask, anisotropically etching the first polysilicon film with the mask for exposing the epitaxial layer, diffusing the impurities with which the first polysilicon film is doped from a contact face between the first polysilicon film and the epitaxial layer to the epitaxial layer and forming an external base region, forming a second silicon oxide film on a surface of the epitaxial layer, forming an intrinsic base region in a portion of the epitaxial layer where the second silicon oxide film is formed by ion implantation, forming a third silicon oxide film on the epitaxial layer, etching back the third silicon oxide film for exposing the intrinsic base region, forming a second polysilicon film on the epitaxial layer and the third silicon oxide film so as to contact to the exposed intrinsic base region, doping the second polysilicon film with impurities of second conductive type, and diffusing the impurities with which the second polysilicon film is doped from a contact face between the second polysilicon film and the epitaxial layer to the epitaxial layer and forming an emitter region surrounded by the intrinsic base region. Thus, the top end part of the proximity region of the first polysilicon film to the second polysilicon film is rounded, the spacing between the first and second polysilicon films can be held wide, and a high-reliability semiconductor device having stable characteristics can be provided.

The second silicon oxide film is a thermal oxide film. Damage to the epitaxial layer in the ion implantation step for forming the intrinsic base region can be decreased and a semiconductor device having higher reliability can be provided.

The third silicon oxide film is a TEOS (tetra-ethyl-orthosilicate) film. Since the TEOS film has good step coverage and conformity, the spacer film made of the TEOS film can be formed between the first and second polysilicon films without causing defects such as cavities for the first polysilicon film and the oxide film mask formed thereon which are made complicated shape by the isotropic etching and anisotropic etching, and the film thickness of the spacer film can be controlled easily. Therefore, a high-reliability semiconductor device having stable characteristics can be provided.

The isotropic etching is performed by using a dry etching method. Thus, the anisotropic etching following the isotropic etching can be performed successively in the same system, the manufacturing process can be simplified, and a semiconductor device having higher reliability can be provided.

The isotropic etching and the anisotropic etching are performed successively in the same system. Thus, the manufacturing process can be simplified and a semiconductor device having higher reliability can be provided.

Mixture gas of $SF_6$, HBr, and He is used in the isotropic etching step. Thus, the isotropic etching and the subsequent anisotropic etching can be executed successively in the same system simply by changing the flow quantity ration between $SF_6$ and HBr, the manufacturing process can be simplified, and a semiconductor device having higher reliability can be provided.

What is claimed is:

1. A semiconductor device comprising:
   a dopant impurity region of first conductivity type formed on a main face of a semiconductor substrate, a part of said impurity region being exposed at a surface of the substrate;
   a dopant impurity region of second conductivity type surrounded by said impurity region of first conductivity type, a part of said impurity region of second conductivity type being exposed at said substrate surface;
   a first electrode formed on the semiconductor substrate and connected to the exposed part of said impurity region of first conductivity type;
   a second electrode formed on the semiconductor substrate and connected to the exposed part of said impurity region of second conductivity type;
   an insulating film sandwiched between said first and second electrodes, wherein
   the top surface of a corner portion of said first electrode facing said second electrode is cut away so as to be rounded, such that the distance between said rounded cut away portion of said first electrode and the facing portion of said second electrode is greater than the distance between said first electrode and said second electrode at all other facing portions.

2. The semiconductor device as claimed in claim 1, wherein the top surface of the corner portion of the first electrode is cut away so as to be rounded by a process comprising isotropic etching followed by anisotropic etching.

3. The semiconductor device as claimed in claim 1, wherein the top surface of the corner portion of the first electrode is cut away so as to be a convexly rounded portion.

4. The semiconductor device as claimed in claim 1, wherein said dopant impurity region of first conductivity type is a base region and said first electrode is a base electrode.

5. The semiconductor device as claimed in claim 1, wherein said dopant impurity region of second conductivity type is an emitter region and said second electrode is an emitter electrode.

6. A semiconductor device comprising:
   a dopant impurity region of first conductivity type formed on a main face of a semiconductor substrate, a part of said impurity region being exposed at a surface of the substrate;
   a dopant impurity region of second conductivity type surrounded by said impurity region of first conductivity type, a part of said impurity region of second conductivity type being exposed at said substrate surface;
   a first electrode formed on said semiconductor substrate and connected to said exposed part of said impurity region of first conductivity type;
   a second electrode formed on said semiconductor substrate and connected to said exposed part of said impurity region of second conductivity type;
   an insulating film sandwiched between said first and second electrodes; and
   a top surface of a corner portion of said first electrode is contoured by cutting away such that the distance between said corner portion and the facing portion of said second electrode is greater than the distance between said first electrode and said second electrode at all other facing portions.

* * * * *